United States Patent [19]
Eichman et al.

[11] Patent Number: 5,714,416
[45] Date of Patent: Feb. 3, 1998

[54] SEMICONDUCTOR MEMORY DEVICE AND WRITE-ONCE, READ-ONLY SEMICONDUCTOR MEMORY ARRAY USING AMORPHOUS-SILICON AND METHOD THEREFOR

[75] Inventors: Eric C. Eichman, Phoenix; Thomas C. Salt, Chandler, both of Ariz.

[73] Assignee: Microchip Technology Incorporated, Chandler, Ariz.

[21] Appl. No.: 430,574

[22] Filed: Apr. 28, 1995

Related U.S. Application Data

[62] Division of Ser. No. 296,508, Aug. 26, 1994, Pat. No. 5,457,649.

[51] Int. Cl.$^6$ .................................................. H01L 21/44
[52] U.S. Cl. ........................................ 438/600; 438/131
[58] Field of Search .................... 437/48, 52, 60, 437/195, 197, 198, 199, 200, 922; 257/50, 52, 530

[56] References Cited

U.S. PATENT DOCUMENTS 5,166,901 11/1992 Shaw et al. ........................ 257/530
5,353,246 10/1994 Tsang et al. ....................... 437/52
5,440,167 8/1995 Iranmanesh ...................... 437/922

*Primary Examiner*—Chandra Chaudhari
*Assistant Examiner*—T. Thomas
*Attorney, Agent, or Firm*—Harry M. Weiss; Jeffrey D. Moy; Harry M. Weiss & Associates, P.C.

[57] ABSTRACT

A semiconductor device used as a semiconductor memory device is disclosed which is made of an amorphous silicon material that provides either a "1" or "0" memory state when the amorphous silicon material is in a non-conduction or insulating state and a "0" or "1" memory state when the amorphous silicon material is transformed, by use of a breakdown voltage applied to electrodes coupled thereto, into a conducting state. The amorphous silicon material is located adjacent to a doped semiconductor region of a semiconductor substrate separated only by a relatively thin primarily metal ohmic contact. The resulting semiconductor structure for the semiconductor device or semiconductor memory device is primarily a single level metalization type structure. A write-once, read-only semiconductor memory array is also disclosed which uses, as each memory cell of the array, one of the disclosed semiconductor memory devices. Methods for producing the semiconductor memory device and write-once, read-only semiconductor memory array are also disclosed.

12 Claims, 2 Drawing Sheets

WRITE-ONCE, READ ONLY, SEMICONDUCTOR MEMORY ARRAY

METAL-a-Si-DOPED SILICON
FUSE CONTACT B

METAL - a-Si - DOPED SILICON
FUSE CONTACT A

WRITE-ONCE, READ ONLY, SEMICONDUCTOR MEMORY ARRAY

SEMICONDUCTOR MEMORY DEVICE AND WRITE-ONCE, READ-ONLY SEMICONDUCTOR MEMORY ARRAY USING AMORPHOUS-SILICON AND METHOD THEREFOR

This is a divisional patent application of U.S. Ser. No. 08/296,508; filed Aug. 26, 1994 now U.S. Pat. No. 5,457,649 which issued on Oct. 10, 1995.

FIELD OF THE INVENTION

This invention relates generally to semiconductor devices, semiconductor memory devices and memory arrays, and methods therefor and, more particularly, relates to improved fuse type semiconductor devices, memory devices, and write-once, read-only semiconductor memory arrays using amorphous-silicon fuse type semiconductor memory devices as the memory cells for the array, and methods therefor.

BACKGROUND OF THE PRIOR ART

In the past, various types of semiconductor devices and memory devices were created to provide a semiconductor memory system which would incorporate these semiconductor memory devices. In the fabrication of semiconductor memory devices in order to produce a high density semiconductor memory array, it is important and critical to provide a semiconductor memory device that is reliable, small, relatively easy to manufacture, and, of course, cost effective.

In the fabrication of ROM (read only memory) type semiconductor memory arrays or systems, the technology has developed to the point where there are many different types of ROM type semiconductor memory arrays or systems. For example, one type of semiconductor ROM type array or system is a system where the data (either a "1" or a "0") can only be read from the ROM type semiconductor memory array or system and there is no possibility of changing the preset or selected memory storage pattern of "1"s and "0"s located therein. In other words, there is no chance of performing a write operation to change the information located in this type of ROM.

Another type of semiconductor memory ROM system or array is the use of a write-once, read-only semiconductor memory system or array wherein information can be written into the semiconductor memory ROM system only once and then this semiconductor memory ROM type system provides a preset amount of data therefrom. However, the important advantage of such a write-once, read-only semiconductor memory array is that each memory cell in the array that has not been subjected to a write operation can have its memory state changed from its prior "1" or "0" memory state to the other "0" or "1" memory state thereby providing a great deal of flexibility using such a ROM type memory array. Other semiconductor memory ROM type systems or arrays utilize an erasable technique or process wherein either a "1" or a "0" can be written into any desired memory cell of the semiconductor memory array or system and these information states can be repeatedly changed for each memory cell location in the memory system. One problem associated with these erasable type semiconductor memory arrays used as a ROM type memory is that the fabrication process is generally very complex and thereby expensive with a resultant difficulty in obtaining high yields.

This invention is directed to the write-once, read-only semiconductor memory array or system wherein information is written once only into a memory cell and once that memory cell receives a write operation of either a "1" or a "0", as preselected, the new preselected memory state that is now written into the memory cell cannot be changed to the other memory state for that particular memory cell location. Initially, write-once, read-only memory systems usually were fabricated with metal type fuses for the memory cells that would be burned out to provide an "open" or nonconducting memory state that is representative of a "1" or a "0", as desired and selected. The burning out of each metal fuse was permanent and resulted in the one time write operation for the write-once, read-only type semiconductor memory array. Each of the memory cells contained one of these metal fuses and, depending upon the coincidence of a combined write pulse directed from both a word driver and a write driver to that particular selected (for a write operation) memory cell, any metal fuse could be selected to cause it to burn out and create an open thereby providing a memory state of either a "1" or a "0" depending upon whether the burned out fuse condition was considered to be a "1" or a "0" memory state. These metal fuses that were used as a memory cell device were generally made solely of metal materials and were generally provided in a separate metal deposition type process operation. As a result, standard semiconductor processing techniques were generally not used in the formation of these prior metal fuse structures.

Another prior art write-once, read-only semiconductor memory array arrangement tried to overcome the even prior metal fuse technology by using a technique to breakdown the dielectric material (i.e. silicon dioxide) located on a surface of a semiconductor substrate, however, it was difficult to coordinate the amount of breakdown voltage needed which required consistently forming the same thickness of dielectric material.

Various other types of semiconductor devices were developed to try to provide a fuse type function where amorphous silicon was used as a material in these devices that acted as an insulator (non-conductor) before being subjected to a certain breakdown voltage that transformed this material from an insulator to a conductor. However, these prior type semiconductor devices required a number of additional processing operations, were fairly complex, produced the fuse type structures as part of a second level metalization process (which is more expensive and much harder to manufacture (lower yields) than using a single level metalization process operation). Also, these prior semiconductor fuse type structures were usually formed a relatively long distance away from a semiconductor substrate and were generally positioned above an underlying doped polysilicon layer or a metal conductor layer located above the semiconductor substrate to serve as an electrical conductor or electrode to connect to a plurality of similar semiconductor fuse type structures.

Accordingly, there was definitely a need to provide a new form of semiconductor memory fuse type device that would be compatible with semiconductor processing techniques, that would be relatively easier (and less costly) to manufacture, that would be closer to its underlying semiconductor substrate, that would use a relatively small breakdown voltage and which would permit the use of this semiconductor fuse type device in a single or one level metalization type structure for a write-once, read-only semiconductor memory array or system. It was especially important to provide such a single level metalization semiconductor fuse type device which would be less costly to manufacture and very reliable for use in a write-once, read-only semiconductor memory array or system.

SUMMARY OF THE INVENTION

It is an object of this invention to provide an improved semiconductor device.

It is a further object of this invention to provide an improved semiconductor memory device.

It is another object of this invention to provide an improved write-once, read-only semiconductor memory array.

It is a still further object of this invention to provide an improved method of producing an improved semiconductor device.

It is still another object of this invention to provide an improved method of producing an improved semiconductor memory device.

It is another object of this invention to provide an improved method of producing an improved write-once, read-only semiconductor memory array.

It is still another object of this invention to provide an improved semiconductor device, semiconductor memory device, and write-once, read-only semiconductor memory array and methods therefor which uses an amorphous silicon material as a fuse type structure close to an underlying semiconductor substrate in a single metalization type structure.

A BRIEF DESCRIPTION OF THE PREFERRED EMBODIMENTS

In accordance with one preferred embodiment of this invention, a semiconductor memory device is provided which comprises a semiconductor substrate having a doped semiconductor region and a dielectric layer on one surface thereof and at least one opening in the dielectric layer to permit electrical contact to be made to the doped semiconductor region. A primarily metal ohmic contact is located in the opening and is in electrical ohmic contact with the doped semiconductor region of the semiconductor substrate. This semiconductor memory device also includes semiconductor memory means in contact with the ohmic contact and comprising amorphous silicon (hereafter referred to as a-silicon) material for providing a non-conducting state of memory representative of one of a "1" and "0" memory state when the a-silicon material functions as an insulator and for providing a conducting state of memory representative of the other of the "1" and "0" memory state when the a-silicon material functions as an electrical conductor. The semiconductor memory device also comprises electrode means including the ohmic contact and the doped semiconductor region as at least one electrode coupled to the semiconductor memory means for selectively applying thereto one of a voltage below a preselected breakdown voltage to maintain the a-silicon material in the non-conducting state and a voltage at least equal to the preselected breakdown voltage to place the a-silicon material in the conducting state.

In accordance with another preferred embodiment of this invention, a write-once, read-only semiconductor memory array is provided which comprises a plurality of semiconductor memory cell elements interconnected to provide the semiconductor memory array. Each one of the plurality of semiconductor memory cell elements comprises a semiconductor substrate having a doped semiconductor region and a dielectric layer on one surface thereof and at least one opening located in the dielectric layer to permit electrical contact to be made to the doped semiconductor region. A primarily metal ohmic contact is located in the opening and in electric ohmic contact with the doped semiconductor region of the semiconductor substrate. Each of the memory cell elements also includes semiconductor memory means in contact with the ohmic contact and comprising a-silicon material for providing a non-conducting state of memory representative of one of a "1" and "0" memory state when the a-silicon material functions as an insulator and for providing a conducting state of memory representative of the other "1" and "0" memory state when the a-silicon material functions as an electrical conductor. Writing means are provided coupled to each one of the plurality of semiconductor memory cell elements for selectively providing a write-once operation to any of the plurality of semiconductor memory cell elements by applying a voltage at least equal to a preselected breakdown voltage thereto. The writing means comprise electrode means including the ohmic contract and the doped semiconductor region as one electrode coupled to the semiconductor memory means of each of the plurality of semiconductor memory cell elements for selectively applying thereto one of a voltage below the preselected breakdown voltage to maintain the a-silicon material in the non-conducting state of memory and the voltage at least equal to the preselected breakdown voltage to place the a-silicon material in the conducting state of memory. The write-once, read-only semiconductor memory array also comprises reading means coupled to each one of the plurality of semiconductor memory cell elements for sensing which of the plurality of semiconductor memory cell elements is in the conducting state of memory and which of the plurality of semiconductor memory cell elements is in the non-conducting state of memory.

In accordance with a further embodiment of this invention, a method of producing a semiconductor memory device is provided which comprises the steps of forming a semiconductor substrate having a doped semiconductor region and a dielectric layer on one surface thereof and at least one opening in the dielectric layer to permit electrical contact to be made to the doped semiconductor region. The method also comprises forming a primarily metal ohmic contact in the opening and in electrical ohmic contact with the doped semiconductor region of the semiconductor substrate. The method further comprises providing semiconductor memory means comprising a-silicon material for producing a non-conducting state of memory representative of one of a "1" and "0" memory state when the a-silicon material functions as an insulator and for providing a conducting state of memory representative of the other of the "1" and "0" memory state when the a-silicon material functions as an electrical conductor. The method further comprises coupling electrode means including the ohmic contact and the doped semiconductor region as at least one electrode to the semiconductor memory means for selectively applying thereto one of a voltage below a preselected breakdown voltage to maintain the a-silicon material in the non-conducting state and a voltage at least equal to the preselected breakdown voltage to place the a-silicon material in the conducting state.

In accordance with a still further embodiment of this invention, a method of producing a write-once, read-only semiconductor memory array is provided which comprises the steps of providing a plurality of semiconductor memory cell elements interconnected to provide the semiconductor memory array. Each one of the plurality of semiconductor memory cell elements having a semiconductor substrate region and a dielectric layer on one surface thereof and at least one opening located in the dielectric layer to permit electrical contact to be made to a doped semiconductor region. Each of these memory cell elements also comprise a primarily metal ohmic contact located in the opening and in electrical ohmic contact with the doped semiconductor region of the semiconductor substrate. Each one of these memory cell elements further comprising semiconductor memory means in contact with the ohmic contact and comprising a-silicon material for providing a non-conducting state of memory representative of one of a "1" and "0" memory state when the a-silicon material functions as an insulator and for providing a conducting state of memory representative of the other of the "1" and "0" memory state when the a-silicon material functions as an electrical conductor. This method further comprises coupling writing means to each one of the plurality of semiconductor memory cell elements for selectively providing a write-once operation to any of the plurality of semiconductor memory cell elements by applying a voltage at least equal to a preselected breakdown voltage thereto. The coupling of the writing means comprising coupling electrode means including the ohmic contact and the doped semiconductor region as at least one electrode to the semiconductor memory means of each of the plurality of semiconductor memory cell elements for selectively applying thereto one of a voltage below the preselected breakdown voltage to maintain the a-silicon material in the non-conducting state of memory and the voltage at least equal to the preselected breakdown voltage to place the a-silicon material in said conducting state of memory. This method also comprises coupling reading means to each one of the plurality of semiconductor memory cell elements for sensing which of the plurality of semiconductor memory cell elements is in the conducting state of memory and which of the plurality of semiconductor memory cell elements is in the non-conducting state of memory.

The foregoing and other objects, features and advantages of this invention will be apparent from the following more particular description of the preferred embodiments of the invention as illustrates in the accompanying drawings.

DESCRIPTION OF THE PREFERRED EMBODIMENTS

Figure 1:
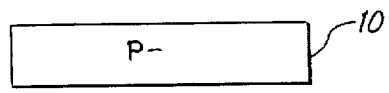
FIG. 1 is a side elevational view of a portion of a semiconductor wafer thereby depicting a semiconductor substrate preferably having a P- type impurity concentration therein and preferably made of silicon.

Referring to FIG. 1, a portion of a semiconductor wafer is depicted by semiconductor substrate 10 which is preferably of a P-type impurity concentration as shown. This P- substrate 10 is preferably made of silicon and is formed using conventional crystal growing techniques to form a rod of P- semiconductor material that is then cut into semiconductor wafers. The P type impurity in the semiconductor substrate 10 can be boron or any suitable P type dopant.

Figure 2:
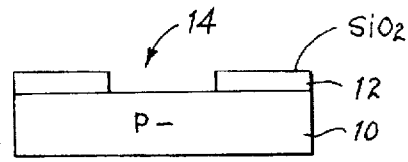
FIG. 2 is a similar side elevational view of the semiconductor substrate of FIG. 1 with the addition of a patterned coating of silicon dioxide thereon following a photolithographic masking and etching operation to form an opening in the silicon dioxide coating or layer.

Referring to FIG. 2, a silicon dioxide layer 12 is deposited such as by a CVD (chemical vapor deposition) process or thermally grown on a top surface of the P- silicon substrate 10 and subsequently an opening 14 is formed in the silicon dioxide layer 12 preferably by photolithographic masking and etching techniques. The thickness of the silicon dioxide layer 12 is selected, as desired, to meet certain processing conditions that may be required.

Figure 3:
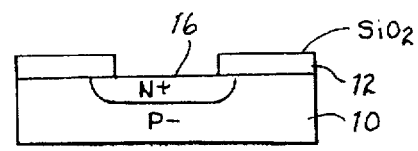
FIG. 3 is a view similar to FIG. 2 after the formation within a surface portion of the P- substrate of an N+ type region through the opening in the patterned silicon dioxide layer.

Referring to FIG. 3, an N+ semiconductor region 16 is formed in a surface portion of the P- semiconductor substrate 10 preferably by means of a diffusion or ion implantation process which produces the N+ region 16 in the P- substrate 10 through the opening in the silicon dioxide layer 12. The N+ region 16 is doped with any suitable N type dopant such as phosphorous.

Figure 4:
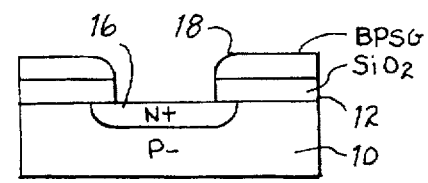
FIG. 4 is a view similar to FIG. 3 after the deposition and/or formation of a boron phosphosilicate glass coating or layer over the silicon dioxide patterned layer and also after the photolithographic masking and etching away of a portion of the boron phosphosilicate glass layer that was lying on or over the N+ semiconductor surface region.

Referring to FIG. 4, a boron phosphosilicate glass coating or layer 18 is deposited over the entire surface of the silicon dioxide layer 12 and by means of photolithographic masking and etching techniques an opening (as shown in FIG. 4) is formed in the boron phosphosilicate glass layer 18 which opening also penetrates through the silicon dioxide layer 12. The thickness of the boron phosphosilicate glass layer 18 can be selected, as desired, but is preferable thicker than the underlying silicon dioxide layer 12. The deposition process step to deposit the boron phosphosilicate glass layer 18 can be varied, as desired, to select the desired percentages of boron, phosphorous and silicon in the formation of the boron phosphosilicate glass layer 18.

Figure 5:
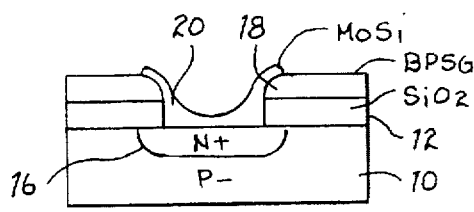
FIG. 5 is a view similar to FIG. 4, but after the deposition of a molybdenum silicon ohmic metal material and subsequent photolithographic masking and etching operation to provide an ohmic contact to the N+ semiconductor region located in the P- semiconductor wafer and this electrical ohmic contact is made to the N+ semiconductor region through the opening in the boron phosphosilicate glass layer that was formed in the deposition and subsequent photolithographic masking and etching operation depicted in FIG. 4.

Referring to FIG. 5, subsequent to the formation of the boron phosphosilicate glass layer 18 on the silicon dioxide layer 12, a primarily metal deposition step is performed to deposit molybdenum silicon material in order to form a molybdenum silicon electrode or ohmic contact 20 in electrical contact with the underlying N+ region 16 that is beneath the opening that is located in the boron phosphosilicate glass layer 18 and the adjacent silicon dioxide layer 12. By photolithographic masking and etching techniques, the molybdenum silicon (primarily) metal alloy contact 20 is reduced to the configuration shown in FIG. 5 and thereby provides a good ohmic electrical contact to the N+ underlying semiconductor region 16 located in the P- substrate 10. The percentages of molybdenum to silicon in the molybdenum silicon contact or electrode 20 can be varied, as desired, but, preferably, molybdenum is a very large percentage of the alloy forming the electrode 20 with silicon preferably being a small percentage thereof. The deposition step to deposit the molybdenum silicon material 20 can be performed using any known deposition process such as by evaporation, sputtering, etc.

Figure 6:
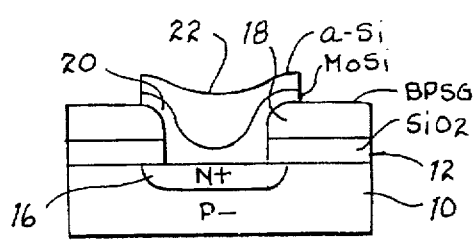
FIG. 6 is a view similar to FIG. 5 after the deposition of an a- silicon material followed by a photolithographic masking and etching operation to provide a portion of the a-silicon layer over or on the molybdenum silicon ohmic contact material.

Referring to FIG. 6, by using deposition techniques such as by CVD or by sputtering an a- silicon layer or region 22 is formed or deposited on the surface of the semiconductor structure shown in FIG. 6 and, subsequently, by using photolithographic masking and etching techniques the a- silicon region or layer 20 is reduced to the configuration shown in FIG. 6 whereby the a- silicon material 22 is formed only over the molybdenum silicon electrode 20. This a- silicon material 22 is intrinsic type silicon thereby providing the electrical characteristics of an insulator, however, upon the application thereto, as described below, of a suitable breakdown voltage, this a- silicon material 22 can become converted or changed from an insulator to an electrical conductor across the entire width thereof.

Figure 7A:
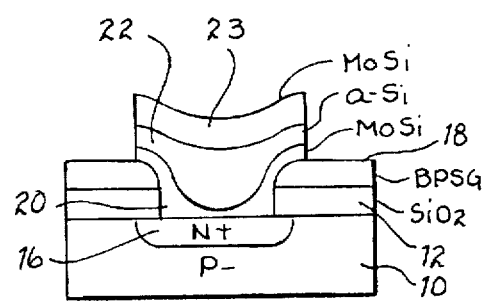
FIG. 7A is a view similar to FIG. 6, but showing an alternative embodiment from the one depicted in FIG. 7 wherein instead of directly applying an aluminum silicon copper electrode material on the surface of the a- silicon semiconductor material a molybdenum silicon material is deposited on the a- silicon material which is then photolithographically masked and etched to provide the configuration depicted in FIG. 7A.
Figure 7:
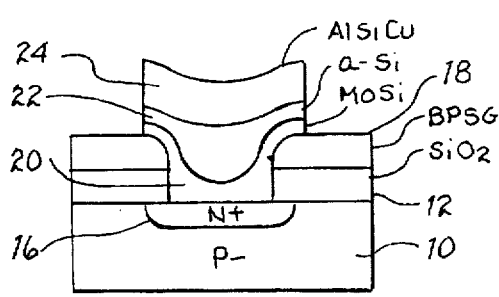
FIG. 7 is a view similar to FIG. 6 after the deposition of an aluminum silicon copper primarily metal electrode type material which is photolithographically masked and etched to provide the portion thereof shown above or on the a-silicon material.

Referring to FIG. 7, following the formation of the a- silicon material 22, a metal deposition process is carried out to deposit an aluminum silicon copper material 24 which is primarily a metal electrode formed on the a- silicon material 22 and in alignment with the molybdenum silicon ohmic contact material 20. This alignment is achieved, as in the case of the formation of the initially formed molybdenum silicon ohmic contact 20 and the underlying a- silicon material 22, using photolithographic masking and etching techniques. Thus, one metal electrode is provided by the aluminum silicon copper material 24 which is located on one side of the a- silicon material 22 which is, as described above, an intermediate material of substantially neutral or intrinsic type material, with the underlying N+ region 16, serving through electrical contact to the a- silicon material or layer 22 by means of ohmic contact 20, as the other electrode to thereby provide a fuse contact for use in each memory cell depicted in the write-once, read-only semiconductor memory array as shown and subsequently described in relation to FIG. 12.

Referring to FIG. 7A, this is an alternative embodiment from the embodiment shown in FIG. 7 wherein the aluminum silicon copper electrode material 24 is not deposited directly on the a- silicon material 22, but instead a second molybdenum silicon material layer or coating 23 is deposited on the a- silicon underlying material 22 and, by means of photolithographic masking and etching techniques, the molybdenum silicon material layer or coating 23 is formed over and in contact with the a- silicon material 22.

Figure 8:
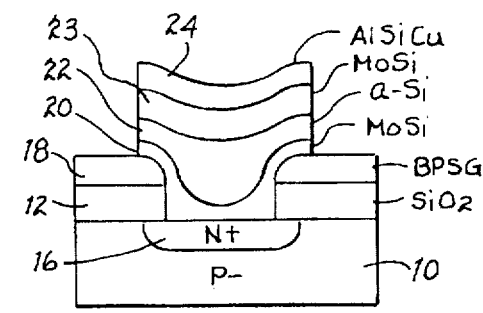
FIG. 8 is a view similar to FIG. 7A and also similar to FIG. 7 wherein aluminum silicon copper material is deposited on the molybdenum silicon material and then photolithographically masked and etched to form a configuration similar to the configuration shown in the embodiment of FIG. 7.

Referring to FIG. 8, the aluminum silicon copper material 24, as shown in FIG. 7 is deposited over the molybdenum silicon material 23 and in electrical contact therewith thereby providing a (primarily) metal (aluminum silicon copper combined with the underlying molybdenum silicon contact) electrode or electrical contact to the a- silicon 22 material which has its other electrode, namely ohmic contact 20 electrically connected to the doped silicon 18 to provide the fuse contact B as shown in FIG. 8 which is similar to the metal - a- silicon - doped silicon fuse contact A of FIG. 7 with the exception of the molybdenum silicon intermediate or barrier layer 23 located between the aluminum silicon copper layer 24 and the a- silicon material 22.

In the embodiments of FIG. 7 and FIG. 8, the silicon dioxide layer 12 is preferably about 2,000 Angstroms thick. The thickness of the boron phosphosilicate glass layer 18 is preferably about 6,000 Angstroms thick, the a- silicon (or non-crystalline amorphous silicon) material 22 is preferably about 2,000 Angstroms thick (+ or −500 Angstroms). The MoSi layer 20 of FIG. 7 and 23 of FIG. 8 is preferably thin and about 300 Angstroms thick.

Figure 9:
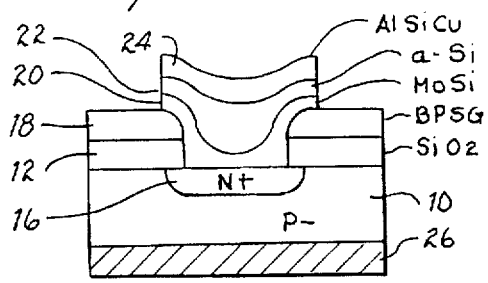
FIG. 9 is a view similar to FIG. 7 wherein an electrode contact is shown on the back side of the P- substrate to provide electrical contact thereto.

Referring to FIG. 9, this figure depicts the embodiment of FIG. 7 with the addition of a metal electrode 26 deposited or formed on the bottom of the P- semiconductor substrate 10 to thereby provide an electrode or contact to the P- substrate 10 for applications where electrical contact to the P- substrate 10 is desired or required. The material of electrode 26 is preferably a primarily metal ohmic contact material such as AlSi or AlSiCu.

Figure 10:
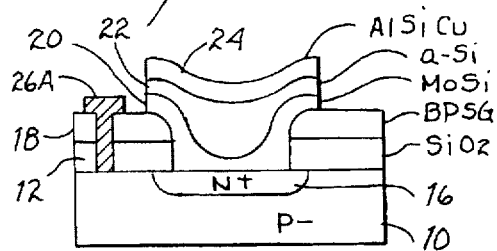
FIG. 10 is also a view similar to FIG. 7 wherein an electrode is in contact with the P- substrate through an opening formed by a photolithographic masking and etching operation in the boron phosphosilicate glass and silicon dioxide layers located on the top surface of the semiconductor substrate.

Referring to FIG. 10, this embodiment depicts the formation of a different top side type of metal contact to the P- substrate 10 as contrasted to the back side contact depicted in FIG. 9. Metal electrode contact 26A is formed on the top of the surface of the semiconductor structure shown in FIG. 10 and extends through an opening formed (by photolithographic masking and etching techniques) in the boron phosphosilicate glass layer 18 and the adjacent silicon dioxide layer 12 into electrical and ohmic contact with the P- semiconductor substrate region 10. The material of electrode 26A can be the same material as described above with respect to electrode 26 in FIG. 9.

Figure 11:
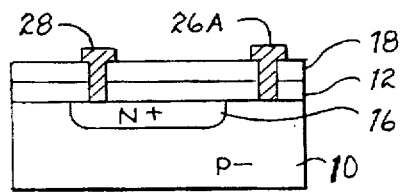
FIG. 11 is a view somewhat similar to FIG. 10 but showing both a metal or electrode contact to the P- substrate and a separate metal contact to the N+ region located in the semiconductor substrate with both metal contacts being on the top of the structure depicted in FIG. 11.

Referring to FIG. 11, this structure depicts a planar type embodiment wherein top side metal contacts are provided to both the N+ underlying semiconductor region 16 and the P-substrate 10. In the embodiment depicted in FIG. 11, this is a view of how electrical contact can be made to the somewhat buried N+ region 16 by providing electrical contact to this N+ region 16 at a location extending out to a region where contact can be made to the N+ region 16 by means of metal contact 28 which is made through an opening formed (by the photolithographic masking and etching techniques) through the boron phosphosilicate glass layer 18 and the adjacent silicon dioxide layer 12. The metal electrode contact 26A is also shown in FIG. 11 (as described with reference to FIG. 10) in electrical connection to the underlying P- substrate 10 through an opening in the boron phosphosilicate glass layer 18 and the adjacent silicon dioxide layer 12. In this manner, electrical ohmic contacts can be made to both the P- substrate 10 and to the N+ semiconductor region 16 on the top surface of the semiconductor structure shown in FIG. 11. Both contacts 26A and 28 are preferably made of the same ohmic contact material.

Figure 12:
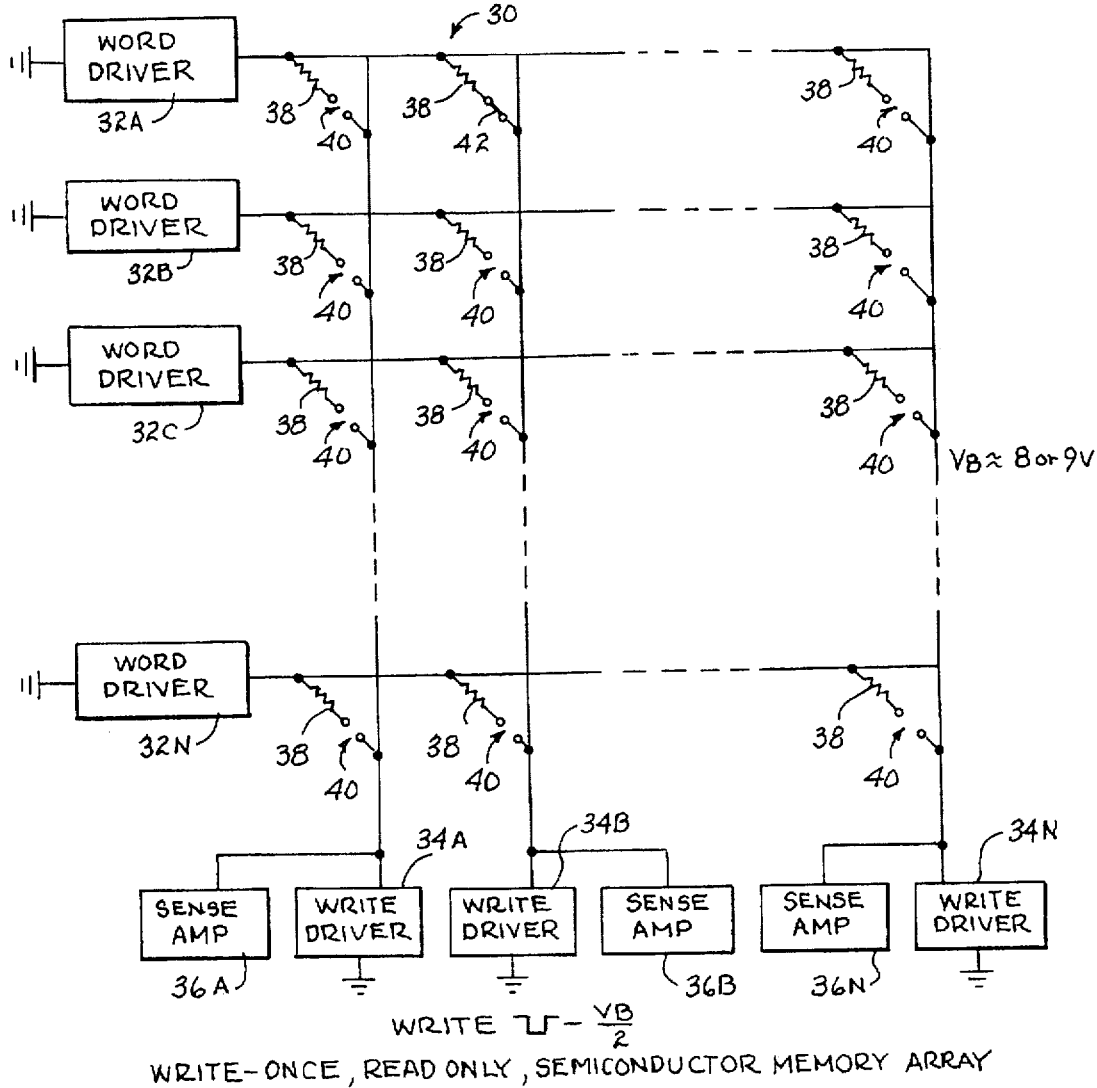
FIG. 12 is a view of a write-once, read-only semiconductor memory array which uses for every memory cell or element of the array a semiconductor device as either depicted in FIG. 7 or as shown in FIG. 8 along with word drivers used in an x axis type configuration and write drivers (and also sense amplifiers) used in an orthogonal y axis type configuration to provide the write-once, read-only semiconductor memory array.

Referring to FIG. 12, this figure depicts a write-once, read-only semiconductor memory array using the semiconductor device or fuse contact A of FIG. 7, or alternatively, the fuse contact B of FIG. 8. The fuse contact A of FIG. 7 or the fuse contact B of FIG. 8 would be located in each of a plurality of memory cells that are connected to both a series of word drivers 32A, 32B, 32C and 32N and a like series of write drivers 34A, 34B and . . . 34N. The word drivers 32A, 32B, 32C and . . . 32N are arranged in a parallel configuration in an x axis layout due to the electrical conductors extending therefrom all extending in parallel to each other along an x axis type direction. Correspondingly, the write drivers 34A, 34B, . . . 34N are also arranged in a parallel configuration in an orthogonal y axis layout due to the electrical conductors extending therefrom all extending in parallel to each other along a y axis type direction. Each of the memory cells are connected (in a slanted type configuration as shown in FIG. 12) to the electrical conductors that extend from each of the word drivers and the write drivers. Electrically connected to the conductor or line coupling the write driver 34A to each of the memory cells that have one end connected to the line is a sense amplifier 36A which senses the current in the line associated with the write driver 34A. Correspondingly, a sense amplifier 36B provides the same function for and connection to the line associated with the write driver 34b. Similarly, sense amplifier 36N provides the same function for the line associated with the write driver 34N. In writing a "1" or a "0" into the write-once, read-only semiconductor memory array of FIG. 12, it is necessary to first establish whether writing a "1" means that you want to have a conducting state for the metal fuse contact A of FIG. 7 or the metal fuse contact B of FIG. 8 or is a "1" a nonconducting state for each of those metal fuse contacts. Either a "1" or a "0" can be the designation, as desired, as long as consistency in the use of the selected designation is maintained for the write-once, read-only semiconductor memory array or system of FIG. 12. Each cross link electrical conductor connection or (slanted) line between the conductor line connected to each word driver (i.e. word driver 32A) and the conductor line connected to the corresponding write driver (i.e. write driver 34A) as shown in FIG. 12 is considered to contain a resistor 38 to provide an indication that there is at least some electrical resistance associated with the fuse type device depicted in FIG. 7 or in FIG. 8. Thus, when any device (of FIG. 7 or FIG. 8) is in an open (non-conducting) state where, as depicted in FIG. 7 or FIG. 8, the a- silicon semiconductor material 22 is in an insulating or non-conducting state, then the fuse type device of FIG. 7 or FIG. 8 which is used as each memory cell of the semiconductor memory array of FIG. 12 is in an open condition as depicted by reference numeral 40 as shown in all of the memory cell locations in the semiconductor memory array of FIG. 12 except for the one memory cell location which is in the coincident slanted conductive line electrically connected up between the word driver 32A and the write driver 34B of FIG. 12. Thus, in order to render the memory cell electrically conducting (which is defined as either a "1" or a "0" state, as desired, a positive voltage pulse of preferably at least half of the breakdown voltage ($V_B$) needed to breakdown the a- silicon material 22 to transform this a-silicon material into an electrically conducting state is applied to the word driver 32A as shown at the top of the word driver 32A. At the same time and coincident with the write voltage pulse of $V_B$ over 2 being applied to the word driver 32A, a voltage pulse of minus $V_B$ over 2 is applied to the write driver 34B thereby causing the fuse type device (or memory cell) depicted in FIG. 7 or FIG. 8 to breakdown the a- silicon semiconductor material 22 to render it conductive. Therefore, line 42 shown in FIG. 12 is a conductive line and not an open as depicted by the reference numerals 40 in all of the other memory cell locations shown in FIG. 12. In this manner, it is possible to write-once into the specific memory cell now depicted by reference number 42 and thereby achieve a ROM (read-only memory) having a desired "1" or a "0" storage state or site depending upon the nomenclature that has been selected for an electrically conducting memory cell state as depicted by reference numeral 42. Once the conducting memory cell state 42 is selected, then it cannot reverse itself and go back to a "0" or "1" (the opposite memory state) from the memory state that is depicted by reference numeral 42. With further reference between FIG. 7 or FIG. 8 and the semiconductor memory array of FIG. 12, the aluminum silicon copper electrode 24 is, for example, in direct electrical contact to the electrically conductive line that extends out from the word driver (i.e. word driver 32A) while the N+ doped semiconductor region 16 (which, in effect, is the other electrode for the fuse contact A (FIG. 7) or the fuse contact B (FIG. 8) to the a- silicon material 22 because of electrical connection thereto due to ohmic contact 20) is in direct electrical contact (such as by means of an external electrode such as an electrode 28 depicted in FIG. 11) to the electrically conductive line that extends out from the write driver (i.e. write driver 34B). As shown in FIG. 12, the breakdown voltage $V_B$ can be, depending on the thickness of the a- silicon material 22, about 8 or 9 volts.

The sense amplifiers 36A, 36B . . . 36N are used in the read operation by sensing current in their respective columns after current is applied by the word driver associated with the row of the semiconductor memory array that information is to be interrogated therefrom. For example, reading of the information contained in the first row is achieved by applying a current to the first row by means of the word driver 32A. Only the second sense amplifier 36B located at the bottom of the second column would sense current flowing down the second column which would indicate that the memory cell having a conducting state 42 is conducting current thereby reading the predesignated "1" or "0" associated with a conducting state as being the memory state of that memory cell 42. The other sense amplifiers 36A, 36N located at the bottom of the other columns would not sense any current because of the open condition of each of the other memory cells.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of producing a semiconductor memory device comprising the steps of:

forming a semiconductor substrate having a doped semiconductor region and a dielectric layer on one surface thereof and at least one opening located in said dielectric layer to permit electrical contact to be made to said doped semiconductor region;

forming a primarily metal ohmic contact in said opening and in electrical ohmic contact with said doped semiconductor region of said semiconductor substrate;

providing semiconductor memory means located only on and in contact with said ohmic contact and comprising a-silicon material for producing a non-conducting state of memory representative of one of a "1" and "0" memory state when said a-silicon material functions as an insulator and for providing a conducting state of memory representative of the other of said "1" and "0" memory state when said a-silicon material functions as an electrical conductor; and coupling electrode means including said ohmic contact and said doped semiconductor region as at least one electrode to said semiconductor memory means for selectively applying thereto one of a voltage below a preselected breakdown voltage to maintain said a-silicon material in said non-conducting state and a voltage at least equal to said preselected breakdown voltage to place said a-silicon material in said conducting state, said electrode means comprising a first electrode and a second electrode, said first electrode is a first primarily metal electrode located only on one portion of said semiconductor memory means, said second electrode is said at least one electrode having said ohmic contact which comprises a second primarily metal electrode coupled to another portion of said semiconductor memory means and in electrical contact with said doped semiconductor region located in said semiconductor substrate.

2. The method of producing a semiconductor memory device of claim 1 wherein said first electrode is an AlSiCu electrode, said second electrode is a MoSi electrode.

3. The method of producing a semiconductor memory device of claim 1 wherein said first electrode is a MoSi electrode and said second electrode in also a MoSi electrode.

4. The method of producing a semiconductor memory device of claim 3 wherein said doped semiconductor region is of N+ type conductivity and said substrate is of P- type conductivity.

5. The method of producing a semiconductor memory device of claim 1 wherein a third primarily metal electrode is electrically connected to said doped semiconductor region.

6. The method of producing a semiconductor memory device of claim 5 wherein a fourth primarily metal electrode is electrically connected to said semiconductor substrate.

7. A method of producing a write-once, read-only semiconductor memory array comprising the steps of:

providing a plurality of semiconductor memory cell elements interconnected to provide said semiconductor memory array, each one of said plurality of semiconductor memory cell elements comprising a semiconductor substrate having a doped semiconductor region and a dielectric layer on one surface thereof and at least one opening located in said dielectric layer to permit electrical contact to be made to said doped semiconductor region, a primarily metal ohmic contact located in said opening and in electrical ohmic contact with said doped semiconductor region of said semiconductor substrate, each one of said memory elements also comprising semiconductor memory means located only on and in contact with said ohmic contact and having a-silicon material for providing a non-conducting state of memory representative of one of a "1" and "0" memory state when said a-silicon material functions as an insulator and for providing a conducting state of memory representative of the other of said "1" and "0" memory state when said a-silicon material functions as an electrical conductor;

coupling writing means to each one of said plurality of semiconductor memory cell elements for selectively providing a write-once operation to any of said plurality of semiconductor memory cell elements by applying a voltage at least equal to a preselected breakdown voltage to said any of said plurality of semiconductor memory cell elements, said coupling of said writing means comprising coupling electrode means including said ohmic contact and said doped semiconductor region as at least one electrode to said semiconductor memory means of each of said plurality of semiconductor memory cell elements for selectively applying thereto one of a voltage below said preselected breakdown voltage to maintain said a-silicon material in said non-conducting state of memory and said voltage at least equal to said preselected breakdown voltage to place said a-silicon material in said conducting state of memory; and coupling reading means to each one of said plurality of semiconductor memory cell elements for sensing which of said plurality of semiconductor memory cell elements is in said conducting state of memory and which of said plurality of semiconductor memory cell elements is in said non-conducting state of memory, said electrode means comprising a first electrode and a second electrode, said first electrode is a first primarily metal electrode located only on one portion of said semiconductor memory means, said second electrode is said at least one electrode having said ohmic contact which comprises a second primarily metal electrode coupled to another portion of said semiconductor memory means and in electrical contact with said doped semiconductor region located in said semiconductor substrate.

8. The method for producing a write-once, read-only semiconductor memory array of claim 7 wherein said first electrode is an AlSiCu electrode, said second electrode is a MoSi electrode.

9. The method for producing a write-once, read-only semiconductor memory array of claim 7 wherein said first electrode is a MoSi electrode and said second electrode in also a MoSi electrode.

10. The method for producing a write-once, read-only semiconductor memory array of claim 9 wherein said doped semiconductor region is of N+ type conductivity and said substrate is of P- type conductivity.

11. The method for producing a write-once, read-only semiconductor memory array of claim 7 wherein a third primarily metal electrode is electrically connected to said doped semiconductor region.

12. The method for producing a write-once, read-only semiconductor memory array of claim 11 wherein a fourth primarily metal electrode is electrically connected to said semiconductor substrate.

* * * * *